United States Patent
Matsumoto et al.

(10) Patent No.: US 10,319,902 B2
(45) Date of Patent: Jun. 11, 2019

(54) MAGNETORESISTIVE DEVICE

(71) Applicant: NATIONAL INSTITUTE OF ADVANCED INDUSTRIAL SCIENCE AND TECHNOLOGY, Tokyo (JP)

(72) Inventors: Rie Matsumoto, Tsukuba (JP); Hiroko Arai, Tsukuba (JP); Shinji Yuasa, Tsukuba (JP); Hiroshi Imamura, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/897,121

(22) Filed: Feb. 14, 2018

(65) Prior Publication Data

US 2018/0233659 A1 Aug. 16, 2018

(30) Foreign Application Priority Data

Feb. 14, 2017 (JP) .................. 2017-025451

(51) Int. Cl.
*H01L 27/22* (2006.01)
*H01L 43/08* (2006.01)
*G01R 33/09* (2006.01)
*H01L 27/12* (2006.01)
*H01L 43/10* (2006.01)

(52) U.S. Cl.
CPC ............ *H01L 43/08* (2013.01); *G01R 33/093* (2013.01); *H01L 27/1222* (2013.01); *H01L 43/10* (2013.01)

(58) Field of Classification Search
CPC .. H01L 21/09331; H01L 21/68; H01L 27/222
USPC ....................................................... 257/421
See application file for complete search history.

(56) References Cited

PUBLICATIONS

E. Kitagawa, et al., "Impact of ultra low power and fast write operation of advanced perpendicular MTJ on power reduction for high-performance mobile CPU", IEDM Tech Dig. (2012) pp. 29.4.1-29.4.4.

*Primary Examiner* — Elias Ullah
(74) *Attorney, Agent, or Firm* — Kenealy Vaidya LLP

(57) ABSTRACT

Some embodiments are directed to a magnetoresistive device, including a free layer having an easy magnetization direction in a perpendicular direction or in an in-plane direction; a fixed layer having the easy magnetization direction which is in the perpendicular direction when the easy magnetization direction of the free layer is in the perpendicular direction or in the in-plane direction when the easy magnetization direction of the free layer is in the in-plane direction; and a non-magnetic layer disposed between the free layer and the fixed layer.

8 Claims, 6 Drawing Sheets

MAGNETORESISTIVE DEVICE

CROSS REFERENCE TO RELATED APPLICATIONS

This application claims priority to Japanese Patent Application No. 2017-025451, filed on Feb. 14, 2017, the content of which is hereby incorporated in its entirety by reference.

BACKGROUND

Some embodiments relate to a magnetoresistive device, and in more concrete terms, to a magnetoresistive device whose switching efficiency ($\kappa$) is high.

A magnetoresistive device (hereinafter simply termed an MR device) fundamentally has a three-layered structure, which is constituted with a free layer, a fixed layer, and a non-magnetic layer disposed between those two layers. There are two types of MR devices: one that exploits the giant magnetoresistance effect (GMR: Giant Magnetoresistance Effect), and the other that exploits the tunnel magnetoresistance effect (TMR: Tunnel Magnetoresistance Effect). With both of these types of MR devices, the orientations of magnetization of the free layer and the fixed layer being parallel (hereinafter this will be termed the parallel configuration) or being anti-parallel (hereinafter this will be termed the anti-parallel configuration), corresponds to either of "0" and "1" of a digital signal. It is expected that MR devices will be implemented in practice as storage cells or unit cells in an MRAM (magnetoresistive random access memory) which will be an alternative to the DRAMs and SRAMs that are currently in wide use. Since MR devices can be miniaturized, it is expected that they will be put into practical use as memory cells for gigabit class non-volatile memories.

Writing information into an MR device is performed by applying a current (i.e. a current pulse) in the direction perpendicular to the three layers of the MR device. When current is flowed to the MR device in this manner, spin transfer torque (STT) acts upon the free layer. By changing the direction in which the current flows, the direction of the free layer is reversed but the direction of the fixed layer is not reversed. In this way, by changing the direction in which the current flows, the magnetization configuration of the free layer and the fixed layer is changed from the parallel configuration to the anti-parallel configuration, or conversely is changed from the anti-parallel configuration to the parallel configuration. Reading out information from the MR device is performed by utilizing the fact that there is a difference in the magnitude of the magnetic resistance (MR) between the free layer and the fixed layer in the parallel configuration and in the anti-parallel configuration (i.e., the magnetoresistance effect). The magnetoresistance effect is evaluated by the MR ratio, and the MR ratio is defined as MR ratio=$[(R_{AP}-R_P)/R_P]\times 100(\%)$. Here, $R_{AP}$ and $R_P$ represent the respective resistances between the free layer and the fixed layer in the anti-parallel configuration and in the parallel configuration. When a current is applied so as to flow in the direction perpendicular to the MR device, the voltage between the free layer and the fixed layer differs depending on whether the magnetization configuration of the free layer and the fixed layer is in the parallel configuration or in the anti-parallel configuration. Of course, the current for reading out information from the MR device is smaller than the current for writing information into the MR device.

While, in the initially produced MR devices, an easy magnetization directions of the free layer and the fixed layer were in-plane (in-plane type), in improved MR devices which have been produced thereafter, an easy magnetization directions of the free layer and the fixed layer were in perpendicular to the plane (perpendicular type). In both the in-plane type MR devices and the perpendicular type MR devices, the easy magnetization directions of the free layer and the fixed layer are the same. In other words, if the easy magnetization direction of the free layer is in-plane, then the easy magnetization direction of the fixed layer is also in-plane. If the easy magnetization direction of the free layer is in perpendicular, then the easy magnetization direction of the fixed layer is also in perpendicular. An MR device in which the easy magnetization directions of the free layer and of the fixed layer are the same is termed a collinear MR device. In this case, "collinear" refers to the state in which the easy magnetization directions are the same when the bias current flowing through the MR device is zero. Here, the state in which the bias current is zero means the state in which no current flows including write current and read current. It should be understood that, since MR devices are usually collinear, they are not particularly referred to as "collinear MR devices" but are normally referred to simply as "MR devices". The threshold current $I_{SW}$ of the free layer is defined as the current that makes the energy barrier height zero. The threshold current $I_{SW}$ may be the minimum value (i.e. the threshold value) of current value needed for writing at absolute zero. Since the power consumption of the MR device depends upon $I_{SW}$, it is desirable for $I_{SW}$ to be as small as possible. The threshold current $I_{SW}$ of a perpendicular type MR device is proportional to an effective first-order anisotropy constant $K_{u1,eff}$, and can be represented by the following expression (A):

$$I_{SW}=4(e\cdot V/h^-)(\alpha/P)K_{u1,eff} \quad (A)$$

Here, e is the elementary electrical charge, V is the volume of the free layer, $h^-$ is the Dirac constant, $\alpha$ is the Gilbert damping constant of the free layer, and P (=0~1) is the spin polarization of the current.

Next, a thermal stability factor of the MR device will be explained. The thermal stability factor $\Delta_0$ is the ratio of the magnetic anisotropy energy of the free layer to the thermal energy. The greater $\Delta_0$ is, the harder it becomes to erase the information "0" or "1", since the magnetization in the free layer becomes more stable. In order for the MR device to be used as a memory cell in a gigabit class non-volatile memory that has a data retention time of ten years or longer, the thermal stability factor $\Delta_0$ is required to be 60 or greater. The $\Delta_0$ of a perpendicular type MR device is proportional to the first order effective anisotropy constant $K_{u1,eff}$, and can be represented by the following expression (B):

$$\Delta_0=K_{u1,eff}V/(k_BT). \quad (B)$$

Here, $k_B$ is Boltzmann's constant, and T is the temperature (unit: Kelvin). From expression (B), it will be understood that it is necessary to make $K_{u1,eff}$ large in order to make $\Delta_0$ large. As is apparent from expression (A), however, when $K_{u1,eff}$ is made large, $I_{SW}$ also becomes large. Therefore, with respect to a perpendicular type MR device, hitherto it has been considered to be impossible to achieve both of small $I_{SW}$ and large $\Delta_0$ by adjusting the anisotropy constant.

In general, spin torque switching efficiency ($\kappa$) is used as an index for showing the degree of coexistence with small $I_{SW}$ and large $\Delta_0$. Spin torque switching efficiency $\kappa$ is defined as $\kappa=\Delta_0/I_{SW}$, and the larger $\kappa$ is, the better is the coexistence of small $I_{SW}$ and large $\Delta_0$. As will be described hereinafter, the second order term ($K_{u2}$) among the uniaxial anisotropy which is expressed with the constants ($K_{u1,eff}$, $K_{u2}$) has been ignored since $K_{u2}$ has been regarded as comparatively small. $K_{u2}$ has been regarded as zero in the setting of the specification for a related art perpendicular type MR device. In such case, the spin torque switching efficiency ($\kappa$) has been particularly expressed as $\kappa^{(p0)}$, and $\kappa^{(p0)}$ has been given by the following expression (C):

$$\kappa = \kappa^{(p0)} = [h^-/(4e\, k_B T)] \times (P/\alpha). \quad (C)$$

Here, $h^-$ is the Dirac constant, e is the elementary electrical charge (a constant), $k_B$ is the Boltzmann constant, and T is the temperature (unit: Kelvin). T is assumed to be substantially a fixed value near room temperature. From expression (C), in order to make $\kappa^{(p0)}$ high, it is necessary to make P (the spin polarization) large, and/or to make $\alpha$ (the Gilbert damping constant of the free layer) small. Various types of materials and techniques for accomplishing high $\kappa^{(p0)}$, for example, been proposed in E. Kitagawa et al., IEDM Tech. Dig. (2012), pp. 29.4.1 through 29.4.4. However, the spin torque switching efficiency $\kappa^{(p0)}$ has not been greatly increased. This is also the case for in-plane type MR devices.

SUMMARY

Some embodiments are directed to an MR device whose spin torque switching efficiency ($\kappa$) is high.

In connection with MR devices, up until the present time the second order term ($K_{u2}$) among the uniaxial anisotropy energy ($K_{u1,eff}$, $K_{u2}$) has been ignored, since $K_{u2}$ has been regarded as comparatively small. The present inventors have concentrated their attention upon this second order term ($K_{u2}$) that has hitherto been ignored, and have particularly focused attention upon materials for the free layer in which the second order term ($K_{u2}$) satisfies the expression ($K_{u2}$)>0 and in which the value thereof is large, and in which the effective first order term ($K_{u1,eff}$) is greater than or equal to zero, namely the expression $K_{u1,eff} \geq 0$ is satisfied. With materials of this sort, it is expected that $\Delta_0$ will at least increase by adding $K_{u1,eff}$ and $K_{u2}$ together, so that a route for improving the value of $\kappa$ will be opened up by adjusting the anisotropy constants. Thus, some embodiments are conceived as a result of advanced research.

According to some embodiments, a magnetoresistive device, includes a free layer, a fixed layer, and a non-magnetic layer disposed between the free layer and the fixed layer, wherein: the free layer has an easy magnetization direction in a perpendicular direction or in an in-plane direction; in the case where the easy magnetization direction of the free layer is in the perpendicular direction, the fixed layer has the easy magnetization direction in the perpendicular direction, whereas, in the case where the easy magnetization direction of the free layer is in the in-plane direction, the fixed layer has the easy magnetization direction in the in-plane direction; and, when a bias current flowing in the free layer is in vicinity of zero, the free layer satisfies both expression (1) and expression (2) below, or satisfies both expression (3) and expression (4) below.

$$K_{u1,eff} > 0 \quad (1)$$

$$r_K \geq 0.1 \quad (2)$$

$$K_{u1,eff} = 0 \quad (3)$$

$$K_{u2} > 0 \quad (4)$$

where $K_{u1,eff}$ is an effective first order anisotropy constant, $K_{u2}$ is a second order anisotropy constant, and $r_K$ is $K_{u2}/K_{u1,eff}$.

It should be understood that "the bias current being in vicinity of zero" means that the bias current has a predetermined value between zero and the value of the read current (including the values at both ends of this range).

In the magnetoresistive device according to some embodiments, it is desirable for a normalized spin torque switching efficiency ($\kappa/\kappa^{(p0)}$) to be higher than or equal to 1.1. Moreover, it is desirable for $r_K$ to be greater than or equal to 0.25; it is more desirable for $r_K$ to be greater than or equal to 0.3; and it is even more desirable for $r_K$ to be greater than or equal to 0.7. Furthermore, it is desirable for $r_K$ to be in the range from 0.7 to 1.5 (including both ends), and more desirable for $r_K$ to be in the range from 0.9 to 1.1 (including both ends). It should be understood that it is even more desirable for $r_K$ to be equal to 1.

DETAILED DESCRIPTION OF EXEMPLARY EMBODIMENTS

Figure 1:
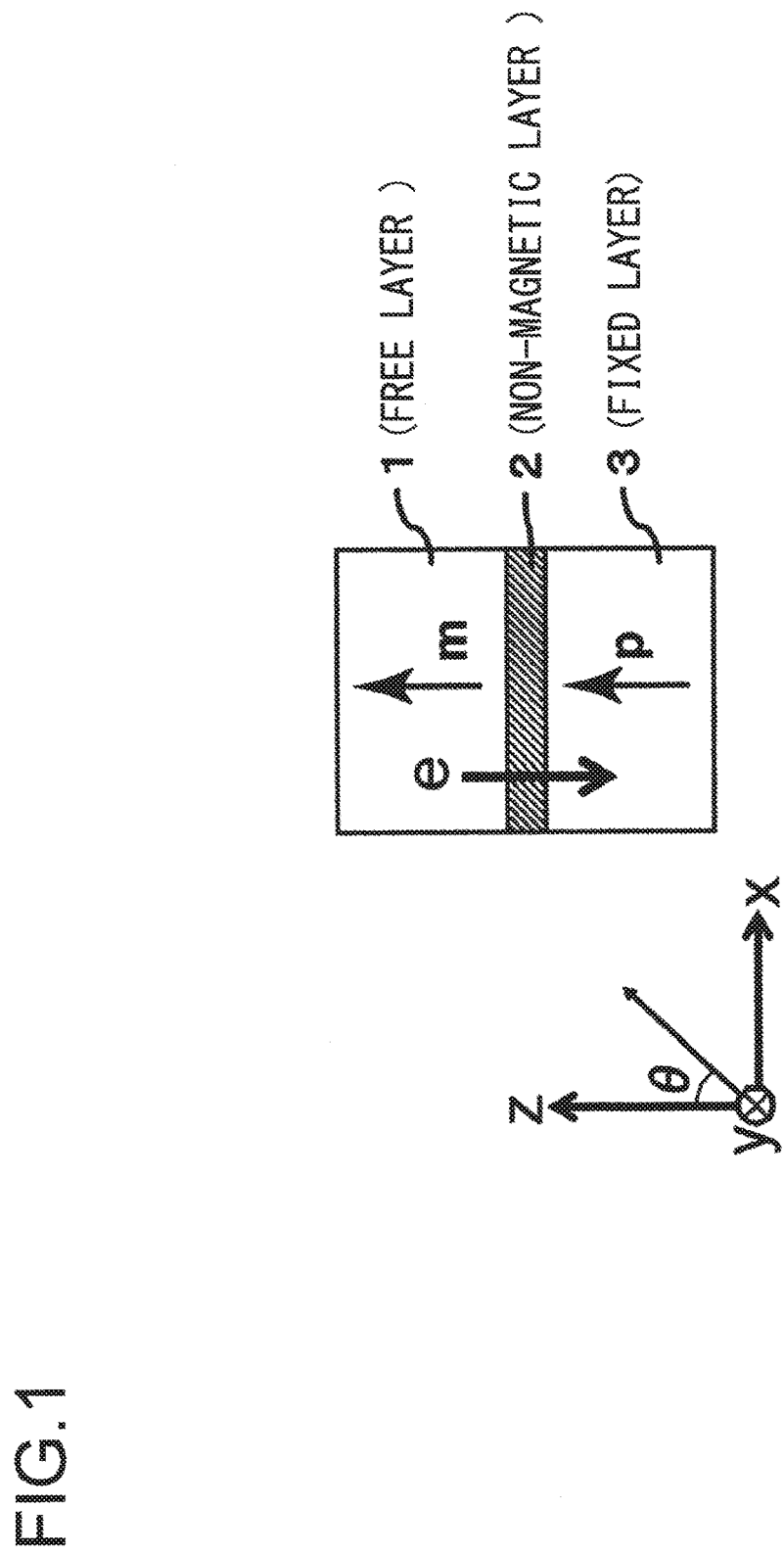
FIG. 1 is a conceptual figure showing a vertical cross section of a perpendicular type MR device (an example)
Figure 2:
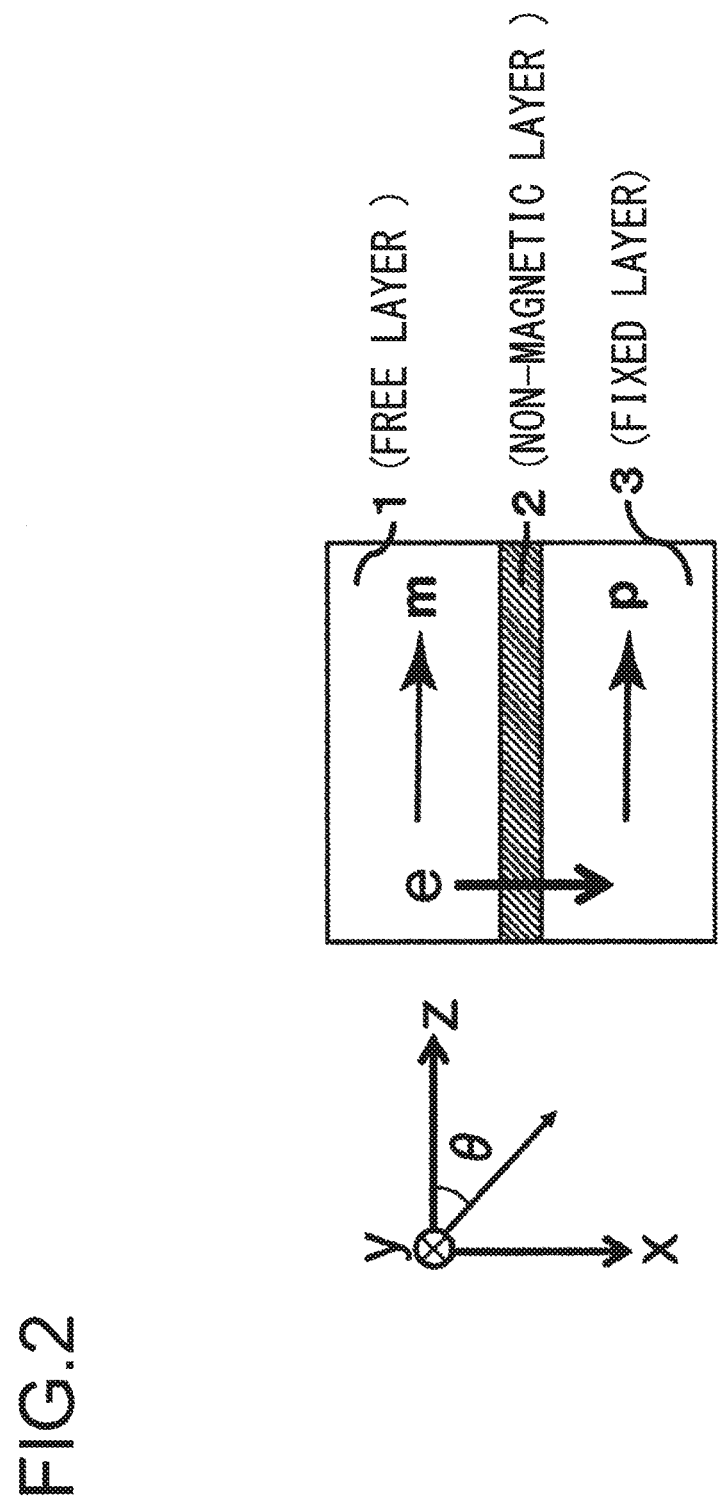
FIG. 2 is a conceptual figure showing a vertical cross section of an in-plane type MR device (an example)

Some embodiments will now be explained with reference to the drawings. FIG. 1 is a conceptual figure showing a vertical cross section of a perpendicular type MR device. FIG. 2 is a conceptual figure showing a vertical cross section of an in-plane type MR device. Each of the MR devices in FIGS. 1 and 2 includes a free layer 1, a fixed layer 3, and a non-magnetic layer 2 that is disposed between the free layer 1 and the fixed layer 3. It should be understood that the arrow with symbol e in FIGS. 1 and 2 shows the direction in which electrons flow at a positive current. Moreover, the direction of magnetization in the free layer 1 is shown as m, while the direction of magnetization in the fixed layer 3 is shown as p. While, in the following, the explanation will be formulated in terms of an example when electrons at a positive current (a bias current) flows in the perpendicular type MR device shown in FIG. 1, a similar explanation also holds for the case of the in-plane type MR device shown in FIG. 2, or when electrons flow at a negative current.

Figure 3:
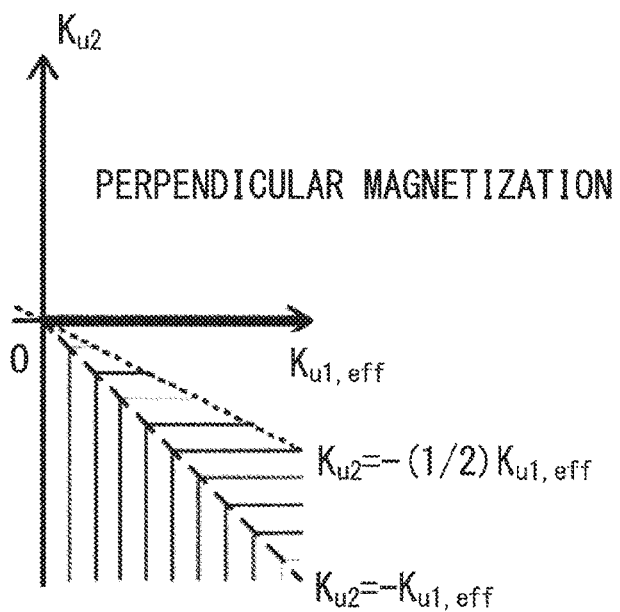
FIG. 3 is a phase diagram showing how, when a bias current is zero, the magnetization state of a free layer changes in dependence upon uniaxial anisotropy constants.

Next, the magnetization state of the free layer will be explained with reference to FIG. 3. FIG. 3 is a phase diagram showing how, when the bias current flowing in the MR device is zero, in other words, when the bias current flowing in the free layer is zero, the magnetization state of the free layer changes in dependence upon the uniaxial anisotropy constants, $K_{u1,eff}$ and $K_{u2}$. In FIG. 3, $K_{u1,eff}$ could become negative with $K_{u1,eff} < 0$ (in this case, the free layer has in-plane magnetization or conical magnetization), however, since the explanation here relates to the perpendicular type MR device shown in FIG. 1, accordingly only the range $K_{u1,eff} \geq 0$ where the free layer can have the perpendicular magnetization state will here be explained. It should be understood that, in the case where the MR device is an in-plane type, exactly the same analysis may be performed by merely changing the z axis from the perpendicular direction to an in-plane direction, as shown in FIG. 2, and the expressions (1) through (4) described above are the same. For $K_{u2}$, this analysis will proceed without any limitation upon the range.

The easy magnetization direction of the free layer of the MR device when the bias current flowing in the free layer is zero will be termed $m_0$. $m_0$ is determined by the energy $E(\theta)$ of the free layer, and $E(\theta)$ is given by the following expression (5):

$$E(\theta) = (K_{u1,eff} \sin^2\theta + K_{u2} \sin^4\theta)V. \quad (5)$$

Here, in the perpendicular type MR device, $K_{u1,eff}$ is given by $K_{u1,eff} = K_{u1} - (1/2)\mu_0 M_s^2$. $K_{u1}$ is the first order anisotropy constant, $\mu_0$ is the magnetic permeability of the vacuum, $M_s$ is the saturation magnetization, and V is the volume of the free layer.

The tilt angle $\theta_0$ (i.e. its polar angle) of the easy magnetization direction $m_0$ of the free layer is obtained as the value that minimizes $E(\theta)$ given by expression (5). In other words:
When $K_{u2} \geq -(1/2)K_{u1,eff}$, then $\theta_0 = 0°$ or $180°$, and this indicates that the free layer is in the perpendicular magnetization state; and
when $K_{u2} < -(1/2)K_{u1,eff}$, then $\theta_0 = 0°$, $90°$, or $180°$, and this indicates that the free layer is in a bistable state where the perpendicular magnetization state and the in-plane magnetization state are both stable. In the range of the bistable state, if $K_{u2} > -K_{u1,eff}$, then the perpendicular magnetization state is the most stable state; while, if $K_{u2} < -K_{u1,eff}$, then the perpendicular magnetization state is a metastable state.

When the bias current flowing in the free layer is zero, then the thermal stability factor $\Delta_0$ of the free layer corresponds to the energy barrier height of the free layer that is normalized by the thermal energy ($k_B T$). The energy barrier height of the free layer with respect to the perpendicular magnetization state may be obtained by subtracting $E(0°)$ or $E(180°)$ from the local maximum value of $E(\theta)$. In the following, if $r_K$ is defined as $r_K = K_{u2}/K_{u1,eff}$, and when $K_{u1,eff} \geq 0$ is considered, the thermal stability factor $\Delta_0$ is given by the following expressions (6) and (7):
When $r_K \geq -1/2$, $$\Delta_0 = (K_{u1,eff} + K_{u2})V/(k_B T). \quad (6)$$

When $r_K < -1/2$, $$\Delta_0 = -K_{u1,eff}^2 V/(4K_{u2} k_B T). \quad (7)$$

The threshold current $I_{SW}$ of the free layer (which is equivalent to the lower limit value of the write current at absolute zero) is defined as being the current that makes the energy barrier height of the free layer zero. And the effective energy $E_{eff}(\theta)$ of the free layer at a predetermined value of bias current is given by the following expression (8):

$$E_{eff}(\theta) = (K_{u1,eff} \sin^2\theta + K_{u2} \sin^4\theta + \mu_0 M_s a_I/\alpha \cos\theta)V \quad (8)$$

where $a_I/\alpha$ represents the effective magnetic field due to spin torque, and $a_I$ is defined as $$a_I = \hbar IP/(2e\mu_0 M_s V).$$

It should be understood that:
The value of $\theta$ in $0° < \theta \leq 90°$ at which $E_{eff}(\theta)$ takes its local maximum value is defined as $\theta_m$; and
the value of $\theta$ in $0° \leq \theta \leq \theta_m$ at which $E_{eff}(\theta)$ takes its local minimum value is defined as $\theta_1$.

The energy barrier height in the perpendicular magnetization state is expressed as $E(\theta_m) - E(\theta_1)$. From the definition that the threshold current $I_{SW}$ is the current that brings the energy barrier height to zero, the threshold current $I_{SW}$ is obtained as follows:
When $r_K > 1/4$ (=0.25), the threshold current is given by the following expression (9):

$$I_{SW} = I_{SW}^{(c)} = \frac{8}{3\sqrt{6}} \frac{eV}{\hbar^-} \frac{\alpha}{P} \sqrt{\frac{(K_{u1,eff} + 2K_{u2})^3}{K_{u2}}}. \quad (9)$$

When $r_K \leq 1/4$ (=0.25), the threshold current is given by the following expression (10):

$$I_{SW} = I_{SW}^{(p0)} = 4(e \cdot V/\hbar^-)(\alpha/P)K_{u1,eff}. \quad (10)$$

The spin torque switching efficiency ($\kappa$) is defined as $\kappa = \Delta_0/I_{sw}$, as described above. In order to demonstrate the superiority compared with the case of a related art perpendicularly magnetized free layer, in other words with $\kappa$ ($=\kappa^{(p0)}$) in $K_{u2}=0$, the value of $\kappa$ normalized by $\kappa^{(p0)}$, i.e. "$\kappa/\kappa^{(p0)}$" (the normalized spin torque switching efficiency) is introduced for comparison. For this purpose, expression (6) (the expression for $\Delta_0$) is divided by expression (9) in the case of $r_K > 1/4$ (=0.25), and expression (6) is divided by expression (10) in the case of $r_K \leq 1/4$ (=0.25), respectively. As a result,
when $r_K > 1/4$ (=0.25), the following expression (11) is obtained:

$$\frac{\kappa}{\kappa^{(p0)}} = \frac{3\sqrt{6}}{2} \frac{\sqrt{r_K}(1+r_K)}{(1+2r_K)^{3/2}}. \quad (11)$$

When $-1/2 \leq r_K \leq 1/4$ (=0.25), the following expression (12) is obtained:

$$\kappa/\kappa^{(p0)} = 1 + r_K. \quad (12)$$

Furthermore, when $r_K < -1/2$, the following expression (13) is obtained by dividing expression (7) (the expression for $\Delta_0$) by expression (10) that gives $I_{sw}$:

$$\kappa/\kappa^{(p0)} = -1/(4r_K). \quad (13)$$

Figure 4:
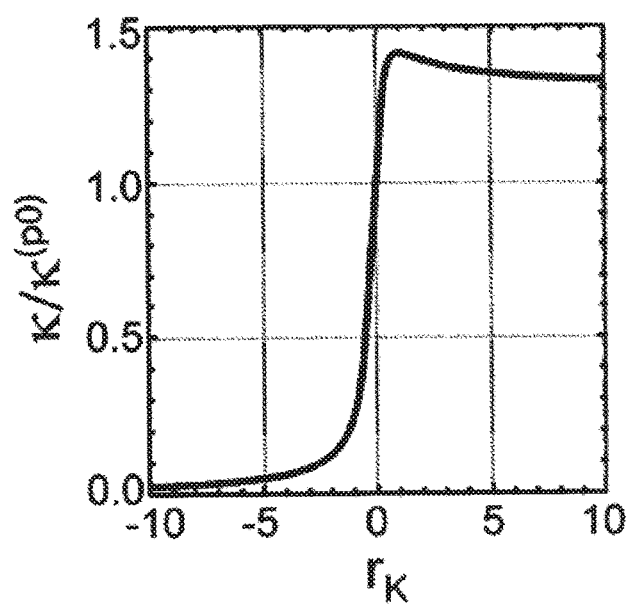
FIG. 4 is a graph for explanation of the relationship between the normalized spin torque switching efficiency $\kappa/\kappa^{(p0)}$ and $r_K$.

FIG. 4 is a graph which plots expressions (11) through (13) described above, showing how $\kappa/\kappa^{(p0)}$ depends upon $r_K$. Since it is difficult to extract numerical values from the graph shown in FIG. 4, accordingly several relationships between $\kappa/\kappa^{(p0)}$ and $r_K$ based upon FIG. 4 are shown in the following Table 1.

TABLE 1

| $r_K$ | NORMALIZED SPIN TORQUE SWITTING EFFICIENCY $\kappa/\kappa^{(p0)}$ |
|---|---|
| 0 | 1.00 |
| 0.05 | 1.05 |
| 0.1 | 1.10 |
| 0.2 | 1.20 |
| 0.25 | 1.25 |
| 0.3 | 1.29 |
| 0.4 | 1.35 |
| 0.5 | 1.38 |
| 0.6 | 1.40 |
| 0.7 | 1.41 |
| 0.8 | 1.41 |
| 0.9 | 1.41 |

TABLE 1-continued

| $r_K$ | NORMALIZED SPIN TORQUE SWITTING EFFICIENCY $\kappa/\kappa^{(p0)}$ |
|---|---|
| 1 | 1.41 |
| 1 | 1.41 |
| 1.1 | 1.41 |
| 1.2 | 1.41 |
| 1.3 | 1.41 |
| 1.4 | 1.41 |
| 1.5 | 1.41 |
| 1.6 | 1.40 |
| 1.7 | 1.40 |
| 1.8 | 1.40 |
| 1.9 | 1.40 |
| 2 | 1.39 |
| 10 | 1.33 |
| 10000 | 1.30 |
| ∞ | 1.30 |

From Table 1, it will be understood that, when $r_K>0$, "$\kappa/\kappa^{(p0)}$" becomes higher than the reference value 1, and the spin torque switching efficiency ($\kappa$) becomes higher than in the related art case of a perpendicularly magnetized free layer ($K_{u2}=0$). Furthermore, when $r_K=1$, then "$\kappa/\kappa^{(p0)}$" reaches its maximum value of $\sqrt{2}$ (the square root of 2). Apart from Table 1, it should be understood that, when $r_K<0$, "$\kappa/\kappa^{(p0)}$" becomes smaller than the reference value 1, and ($\kappa$) becomes lower than in the case of a perpendicularly magnetized free layer for which $K_{u2}=0$.

Thus, in some embodiments, the cases are selected in which a more prominent beneficial effect may be observed than in the case of a related art perpendicularly magnetized free layer ($K_{u2}=0$), in other words, the case (1) in which "$\kappa/\kappa^{(p0)}$" becomes at least 10% higher than in the related art, i.e. "$\kappa/\kappa^{(p0)}$" becomes at least 1.10, namely, $r_K$ is equal to 0.1 or larger (shown by expression (2)), and the case (2) in which "$\kappa/\kappa^{(p0)}$" becomes 1.30, namely, $r_K$ becomes ∞ (infinitely large) are selected. In a succession of the analysis on the premise that $K_{u1,eff} \geq 0$, the former case (1) means the range of $K_{u1,eff}>0$ (expression (1)) and $K_{u2}>0$ (expression (4)), and the latter case (2) means the range of $K_{u1,eff}=0$ (expression (3)) and $K_{u2}>0$ (expression (4)). In other words, some embodiments are achieved as a result of selecting these ranges. Several more desirable selection ranges for some embodiments may be suggested as follows. With respect to following cases, the preferable ranges are listed in an ascending order according to $\kappa/\kappa^{(p0)}$, i.e. in order from the preferable range on the first line to the most preferable range to the last line.

$r_K>0.25(\kappa/\kappa^{(p0)}>1.25)$ $r_K \geq 0.3(\kappa/\kappa^{(p0)} \geq 1.29)$ $r_K \geq 0.7(\kappa/\kappa^{(p0)} \geq 1.41)$ $r_K=0.7$ to $1.5$(including both ends)($\kappa/\kappa^{(p0)} \geq 1.41$)

$r_K=0.9$ to $1.1$(including both ends)($\kappa/\kappa^{(p0)} \geq 1.41$)

Figure 5:
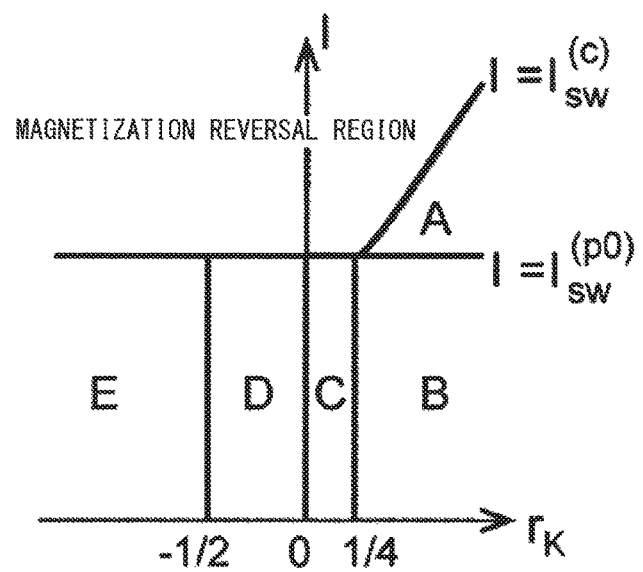
FIG. 5 is a phase diagram that is divided into regions according to the magnetization state of the free layer, when the bias current has certain predetermined values.

As a result of performing more detailed analysis, the present inventors have invented an entirely new MR device. The magnetization state of the free layer is considered in the case where a bias current of a predetermined value is flowed (is applied) in this MR device. As described above, the easy magnetization direction is obtained by calculating the angle $\theta_1$ at which $E_{eff}(\theta)$ takes its local minimum value. The magnetization state of the free layer will now be explained with reference to FIG. 5. FIG. 5 is a phase diagram showing the dependence of the magnetization state of the free layer on $r_K$ and the bias current I ($\geq 0$). When $r_K \leq \frac{1}{4}$ (=0.25) and also $I<I_{SW}^{(p0)}$ (corresponding to the regions C, D, and E in FIG. 5), then $\theta_1=0°$.

Figure 6:
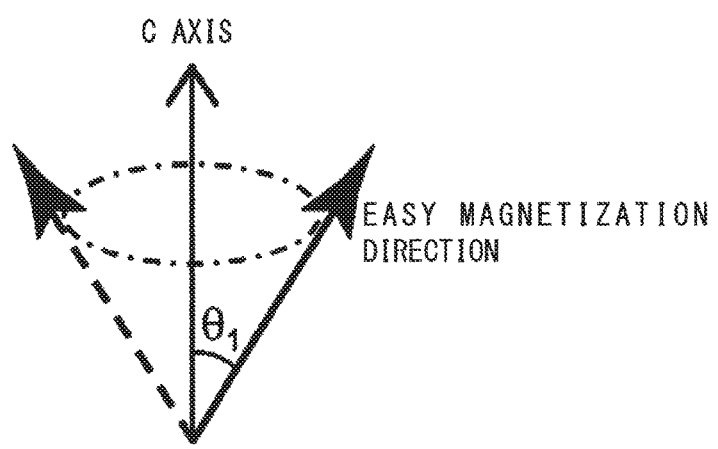
FIG. 6 is a conceptual figure for explanation of the cone magnetization state, and shows that the easy magnetization direction tilted at $\theta_1$ from the c axis (the vertical direction).

Next, the case of $r_K>\frac{1}{4}$ (=0.25) will be explained, with the case $r_K=\frac{1}{4}$ (=0.25) being excluded, in order to distinguish it from the case of $r_K \leq \frac{1}{4}$ (=0.25). In this case, while $\theta_1=0°$ in $0 \leq I \leq I_{SW}^{(p0)}$ (corresponding to the region B in FIG. 5), $\theta_1 \neq 0°$ in $I_{SW}^{(p0)}<I<I_{SW}^{(c)}$ (corresponding to the region A in FIG. 5) (the cone magnetization state; refer to FIG. 6). When a bias current I is applied to the free layer, especially when the value of the bias current I reaches the range "$I_{SW}^{(p0)}<I<I_{SW}^{(c)}$" during the process of rising the value of the bias current I from zero, the direction of magnetization of the free layer starts to tilt from the vertical direction, and the magnetization state becomes the cone magnetization state (refer to FIG. 6). When the value of the bias current I exceeds the threshold current $I_{SW}^{(c)}$, then the direction of magnetization reverses. This is an astounding new discovery. It should be understood that, for the actual manufactured product, it is not technically easy actually to measure in the transient state during application of a bias current I, whether or not the free layer is in the cone magnetization state. Accordingly, it must be decided whether or not some embodiments are being implemented, depending upon whether or not expression (14) and expression (15) described below are satisfied, or expression (16) and expression (17) described below are satisfied.

$$K_{u1,eff}>0 \quad (14)$$

$$r_K>0.25 \quad (15)$$

$$K_{u1,eff}=0 \quad (16)$$

$$K_{u2}>0 \quad (17)$$

In other words, if $r_K>\frac{1}{4}$ (0.25), then, the switching time becomes shorter and the write speed becomes faster. This is because the magnetization of the free layer temporarily becomes the cone magnetization state when the bias current I flowing in the free layer reaches the range of $I_{SW}^{(p0)}<I<I_{SW}^{(c)}$. On the other hand, since the read out current is smaller than the threshold current $I_{SW}$ (in concrete terms, it is 0.7 times the threshold current or less, and desirably is 0.5 times thereof or less), accordingly, the magnetization of the free layer does not go into the cone magnetization state due to the read current. Therefore the MR ratio is not deteriorated; in other words, the S/N ratio is not deteriorated.

In an MR device that is an embodiment, $r_K$ is greater than 0.25 (and desirably greater than or equal to 0.3). Due to this, the normalized spin torque switching efficiency "$\kappa/\kappa^{(p0)}$" is higher than 1.25 (and desirably higher than or equal to 1.29). With an MR device according to some embodiments, in addition to the spin torque switching efficiency ($\kappa$) being high, also the write speed is fast, and there is no deterioration of the MR ratio. Moreover, it has the characteristic that the MR ratio is high compared with an MR device whose free layer is in the cone magnetization state when the bias current flowing in the free layer is zero.

In the following, the layers employed in an MR device according to some embodiments, i.e. a free layer, a non-magnetic layer, and a fixed layer, will be explained in detail.
1. The Free Layer A magnetic material may be selected from ferromagnetic materials for which $K_{u1,eff}$ and $K_{u2}$ are already known, and the free layer may be formed from such magnetic material. If $K_{u1,eff}$ and $K_{u2}$ are unknown, then it is difficult to measure $K_{u1,\mathit{eff}}$ and $K_{u2}$ of the free layer constituting an MR device that has been manufactured, but when the ferromagnetic material as the free layer exists alone, then it is comparatively easy to measure its $K_{u1,\mathit{eff}}$ and $K_{u2}$. Accordingly, it would be acceptable to ascertain the $K_{u1,\mathit{eff}}$ and $K_{u2}$ of a ferromagnetic material layer by measuring its magnetic characteristics when it exists alone, and then to manufacture an MR device by using this ferromagnetic material layer as the free layer. It should be understood that some embodiments are not limited to the case in which the entire free layer is in the perpendicular magnetization state having uniformly positive $K_{u2}$. For example, it will be acceptable to arrange for only a portion of the free layer to have positive $K_{u2}$, and for the other portion thereof to have $K_{u2} \approx 0$, so that, in total, the free layer exhibits positive $K_{u2}$. And, for example, it would also be possible to obtain a free layer having partially positive $K_{u2}$, by creating an interface magnetic anisotropy in the free layer in the neighborhood of the interface with the non-magnetic layer or a cap layer or the like, and by making this interface magnetic anisotropy cooperate with the magnetic anisotropy of the free layer.

The material from which the free layer is made is a ferromagnetic material. Fe, Co, Ni, or alloys thereof (for example Fe—Co) are representative of ferromagnetic materials. Alloys in which B, Si, Ti, Cr, V or the like are added to the above, such as Fe—B, Fe—Co—B, Fe—Co—B—Si, Fe—Co—B—Ti, Fe—Co—B—Cr, Fe—Co—B—V or the like, may also be used as the material for constituting the free layer. Moreover, alloys such as Co—Pt, Co—Pd, Fe—Pt, Fe—Pd or the like, or alloys in which the above alloys are laminated together, or alloys in which B, Cr, or the like is added to the above alloys, may also be used as the material for constituting the free layer. As such laminated alloys, for example, it would be possible to use Co—Pt (111), Co—Pd (111), Co—Ni (111), Ni—Cu (001) or the like as the material for constituting the free layer.

Furthermore, the following materials can also be used as materials constituting the free layer:

(a) A periodic multi-layer film in which a thin layer containing Co and a thin layer containing Pt, Pd or Ni are laminated repeatedly or a superlattice film containing Pt, Pd or Ni, in addition to Co In this case, the thin layers containing Co possibly or preferably, for example, has hcp crystalline structure or fcc (111) crystalline structure. The thin layers containing Pt, Pd, or Ni possibly or preferably have, for example, an fcc (111) crystalline structure, however, some other plane orientation may also be employed. As another example, the thin layers containing Co may be fcc (001) and the thin layer containing Pt, Pd, or Ni may be fcc (001). It is desirable for the thickness of one thin layer containing Co laminated over the thin layer containing Pt to be equivalent to 7 to 10 Co atoms. Furthermore, it is desirable for the thickness of one thin layer containing Co laminated over the thin layer containing Pd to be equivalent to 3 to 4.5 Co atoms.

(b) A multi-layered film or a superlattice film constructed of thin layer (thickness 0.7 nm to 0.9 nm) containing Co laminated over a thin layer (thickness 2 nm) containing Pt (c) A multilayer film obtained by repeatedly laminating together, eight times, a thin layer containing Co (thickness 0.5 nm to 0.7 nm)/a thin layer containing Pt (thickness 2 nm)

(d) A multilayer film obtained by repeatedly laminating together, eight times, a thin layer containing Co (thickness 0.7 nm)/a thin layer containing Pt (thickness 2 nm to 3 nm)

(e) A superlattice film in which a thin layer containing Co having a thickness equivalent to around 1 to 2 Co atoms and a thin layer containing Pt having a thickness equivalent to around 1 to 2 Pt atoms are laminated together alternatingly for several to several tens of cycles (f) A superlattice film in which a thin layer containing Co having a thickness equivalent to around 1 to 2 Co atoms and a thin layer containing Pd having a thickness equivalent to around 1 to 2 Pd atoms are laminated together alternatingly for several to several tens of cycles (g) A multi-layered film or a superlattice film in which a thin layer (thickness 0.2 nm) containing Co is laminated upon a thin layer (thickness 0.4 nm) containing Ni;

(h) A thin alloy film containing Co and having a hexagonal close-packed (hcp) structure (i) A thin film of cobalt-based alloy Such a cobalt-based alloy thin film is also an example of a preferred material for the free layer. The cobalt-based alloy thin film may contain at least one of Pt, Ir, B, Rh, Pd, and Ni. In particular, in the case of a cobalt-based alloy thin film that contains Pt, while it is possible to use Ru as the seed layer, it is more desirable, by choosing Re, Pt, Au, Pd, Ir, or Cu as the material for the seed layer, to make the lattice constant ratio of the cobalt-based alloy large, i.e. its c/a, to make large.

(j) A thin alloy film containing Co, Fe or Ni and having partially positive $K_{u2}$ As concrete examples, the combinations of Co—Pt, Co—Pd, Co—Ni, Co—Au, Co—Ir, Co—Ru, Co—Cr, Co—Rh, Co—Cu, Fe—Pt, Fe—Pd, Fe—Ag, Fe—Ta, Fe—Hf, Fe—Cu, Fe—Au, Fe—Mg—O, Ni—Cu, Ni—Ga—As, or Ni—Au may be applied. Here, the combinations can generate a partially positive $K_{u2}$ by contacting the free layer with the non-magnetic layer or the cap layer and by causing the magnetic anisotropy at the interface and the magnetic anisotropy of the free layer to cooperate.

In the description above, the examples in which crystals are used have been mainly explained. But provided that $K_{u2}$ is positive and that the conditions of some embodiments (expression (1) through expression (4)) are satisfied, it would be possible for the free layer to be a single crystal, a polycrystalline material, a partial crystal, a texture, a nanocrystalline materials, an amorphous, or a mixture of some or all the above.

While the thickness of the free layer relates to the volume V thereof and also to factors other than the volume. That is, a thin free layer, which is desirable from the viewpoint of its low threshold current, but, conversely, has a problem that its thermal stability decreases. Moreover, a thin free layer also has a problem that it is difficult to fabricate a continuous film. On the other hand, a thicker free layer causes a problem that magnetization reversal does not happen unless a large current is applied. Accordingly, the thickness of the free layer is generally, for example, about 1 to 10 nm, and possibly or preferably about 1 to 3 nm.

Example #1 of a Free Layer ($r_K$=0.1)

A free layer is formed as a multi layered film in which two layers of Co (0.2 nm)/Ni (0.4 nm) are alternately laminated for fifteen times upon a thin layer containing Ti. The dimensions of this free layer are thickness d=9 nm, diameter D=19 nm, and volume V=2.55×10³ nm³. Moreover, $K_{u1,\mathit{eff}}$=220 kJ/m³, $K_{u2}$=22 kJ/m³, $r_K$=0.1, and the thermal stability factor $\Delta_0$=149. The Gilbert damping constant of the free layer is α=0.01, the spin polarization is P=0.7, and the threshold current is $I_{SW}$=48.7 μA. Generally, it is desirable for the spin polarization P to be 0.3 to 1, and here the spin polarization of P=0.7 is assumed as an example. The spin torque switching efficiency of the MR device with this free layer is $\kappa=3.06$ $\mu A^{-1}$, and its MR ratio is 192%.

Comparative Example #1 of a Free Layer (A Related Art Perpendicularly Magnetized Free Layer, with $K_{u2}=0$)

The free layer of Comparative Example #1 has the same dimensions and the same $\Delta_0$ as the free layer of Example #1, and its $K_{u1,eff}=242$ kJ/m³ ($K_{u1,eff}$ is made large in order to make the thermal stability factor equal to that in Example #1). Both the Gilbert damping constant $\alpha$ and the spin polarization P are the same as those of the free layer of Example #1, and the threshold current is $I_{SW}=53.6$ $\mu A$. The spin torque switching efficiency of the MR device with this free layer of Comparative Example #1 is $\kappa=2.78$ $\mu A^{-1}$, and its MR ratio is 192%.

Accordingly, it will be understood that the normalized spin torque switching efficiency of the MR device manufactured with the free layer of Example #1 is 1.10 times higher (=3.06/2.78) than the normalized spin torque switching efficiency of the MR device manufactured with the free layer of Comparative Example #1, and moreover that the threshold current $I_{SW}$ of the free layer in Example #1 is smaller than the threshold current $I_{SW}$ of the free layer in Comparative Example #1 by a factor of 90.9% (=48.7/53.6), and thus the MR device manufactured with the free layer of Example #1 is excellent. Furthermore, it will be understood that 192%, which is the MR ratio of the MR device manufactured with the free layer of Embodiment #1, is not deteriorated in comparison with the MR ratio of the MR device manufactured with the free layer of Comparative Example #1.

Example #2 of a Free Layer ($r_K=0.3$)

A free layer is formed by laminating a Co layer upon a thin layer containing Pt. The dimensions of this free layer are thickness d=1.4 nm, diameter D=21 nm, and volume V=4.85×10² nm³. Moreover, $K_{u1,eff}=400$ kJ/m³, $K_{u2}=120$ kJ/m³, $r_K=0.3$, and the thermal stability factor $\Delta_0=60.9$. The Gilbert damping constant of the free layer is $\alpha=0.02$, the spin polarization is P=0.65, and the threshold current is $I_{SW}=36.5$ $\mu A$. The spin torque switching efficiency of the MR device with this free layer is $\kappa=1.67$ $\mu A^{-1}$, and its MR ratio is 146%.

Comparative Example #2 of a Free Layer (A Related Art Perpendicularly Magnetized Free Layer, with $K_{u2}=0$)

The free layer of Comparative Example #2 has the same dimensions and the same $\Delta_0$ as the free layer of Example #2, and its $K_{u1,eff}=520$ kJ/m³ ($K_{u1,eff}$ is made large in order to make the thermal stability factor equal to that in Example #2). Both the Gilbert damping constant $\alpha$ and the spin polarization P are the same as those in Example #2, and the threshold current is $I_{SW}=47.1$ $\mu A$. The spin torque switching efficiency of the MR device with this free layer of Comparative Example #2 is $\kappa=1.29$ $\mu A^{-1}$, and its MR ratio is 146%.

Accordingly, it will be understood that the normalized spin torque switching efficiency of the MR device manufactured with the free layer of Example #2 is 1.29 times higher (=1.67/1.29) than the normalized spin torque switching efficiency of the MR device manufactured with the free layer of Comparative Example #2, and moreover that the threshold current $I_{SW}$ of the free layer of Example #2 is smaller than the threshold current $I_{SW}$ of the free layer of Comparative Example #2 by a factor of 77.5% (=36.5/47.1), and thus the MR device manufactured with the free layer of Example #1 is excellent. Furthermore, it will be understood that 146%, which is the MR ratio of the MR device manufactured with the free layer of Example #2, is not deteriorated in comparison with the MR ratio of the MR device manufactured with the free layer of Comparative Example #2.

Example #3 of a Free Layer ($r_K=1$)

A free layer is formed by laminating a Co layer upon a thin layer containing Pt. The dimensions of this free layer are thickness d=1.8 nm, diameter D=28 nm, and volume V=1.11×10³ nm³. Moreover, $K_{u1,eff}=125$ kJ/m³, $K_{u2}=125$ kJ/m³, $r_K=1$, and the thermal stability factor $\Delta_0=66.9$. The Gilbert damping constant of the free layer is $\alpha=0.02$, the spin polarization P=0.65, and the threshold current $I_{SW}=36.6$ $\mu A$. The spin torque switching efficiency of the MR device with this free layer $\kappa=(1.826)$=about 1.83 $\mu A^{-1}$. The switching time $T_{SW}$ is the time period taken from the start of application of current until the direction of magnetization changes to $\theta=90°$. If a current pulse that includes a time period of 1 ns to raise a current to a value of 60 $\mu A$ is applied as the bias current, then the switching time is $T_{SW}=2.0$ ns, including this 1 ns pulse-rise time. The MR ratio of this MR device is about 146%.

Comparative Example #3 of a Free Layer (A Related Art Perpendicularly Magnetized Free Layer, with $K_{u2}=0$)

The free layer of this Comparative Example #3 has the same dimensions and the same $\Delta_0$ as the free layer of Example #3, and $K_{u1,eff}=250$ kJ/m³ ($K_{u1,eff}$ is made large in order to make the thermal stability factor equal to that in Example #3). Both the Gilbert damping constant $\alpha$ and the spin polarization P are the same as those of the free layer of Example #3, and the threshold current is $I_{SW}=51.8$ $\mu A$. The spin torque switching efficiency of the MR device with this free layer of Comparative Example #3 is $\kappa=(1.291)$=about 1.29 $\mu A^{-1}$. If a current pulse that includes a time period of 1 ns to raise a current to a value of 60 $\mu A$ is applied as the bias current, then the switching time is $T_{SW}=7.4$ ns, including this 1 ns pulse-rise time. The MR ratio of this MR device is about 146%.

Accordingly, it will be understood that the normalized spin torque switching efficiency of the MR device with the free layer of Example #3 is 1.826/1.291=1.414 (theoretically the square root of 2) times higher than the normalized spin torque switching efficiency of the MR device with the free layer of Comparative Example #3, and moreover that the threshold current $I_{SW}$ of the free layer of Example #3 is smaller than the threshold current $I_{SW}$ of the free layer of Comparative Example #3 by a factor of 70.6% (=36.6/51.8), so that Example #3 is excellent. Furthermore, the switching time $T_{SW}$ of the MR device with the free layer of Example #3 is around ⅓ (27%) of the length of the switching time $T_{SW}$ of the MR device with the free layer of Comparative Example #3. Yet further, it will be understood that 146%, which is the MR ratio of the MR device manufactured with the free layer of Example #3, is not deteriorated in comparison with the MR ratio of the MR device manufactured with the free layer of Comparative Example #3.

2. The Non-Magnetic Layer

Material for the non-magnetic layer located between the free layer and the fixed layer, which materials are known per se, either one of (1) a non-magnetic metal (for GMR device), or (2) an insulator material (for TMR device) can be used. In the TMR device, the non-magnetic layer is also called a tunnel barrier layer. In the MR device in some embodiments, these conventional materials may be used for the non-magnetic layer. The followings are specific examples of the materials for the non-magnetic layer.

(1) Non-Magnetic Metals

For example, metals including Cu, Ag, or Cr or the like or alloys of these metals can be used. The non-magnetic layer has a thickness, for example, about 0.3 nm to 10 nm. In particular, when metal or alloy containing Cu or Ag to achieve a large MR ratio is adopted as a non-magnetic layer, the thickness of the non-magnetic layer is, for example, 2 nm to 10 nm.

(2) Insulating Materials

Various dielectric materials, for example, oxides, nitrides, halides and the like of Mg, Al, Si, Ca, Li or the like can be used. In particular, it is preferred that Mg—O (magnesium oxide) that can achieve both of large MR ratio and a small surface resistance is used. In the case where the oxide or nitride is used for the non-magnetic layer, some amounts of oxygen deficiency or nitrogen deficiency may be present in the oxide or nitride. The non-magnetic layer has a thickness of, for example, 0.3 nm to 2 nm.

3. Fixed Layer

The fixed layer is a ferromagnetic material layer having an easy magnetization direction in a perpendicular direction (in the case where the MR device is an in-plane type, the easy magnetization direction is in in-plane direction). Such a ferromagnetic material has been known per se. In the MR device in some embodiments, such conventional material can be used for the fixed layer. Specific examples of such conventional materials are explained below. As typical materials, for example, ferromagnetic metals such as Fe, Co, Ni or the like, or ferrous alloys, for example, Fe—Co can be presented. In the case where the material in an amorphous state is desired as an intermediate state because of the manufacturing process, then alloys additionally containing B (boron), Si, Ti, Cr, or V, such as Fe—B, Fe—Co—B, Fe—Co—B—Si, Fe—Co—B—Ti, Fe—Co—B—Cr, Fe—Co—B—V or the like may be used. In particular, in the case of perpendicular magnetization, alloys such as Co—Pt, Co—Pd, Fe—Pt, Fe—Pd or the like or multi-layer film made of thin layers of such an alloy, or alloys obtained by adding B or Cr or the like to these alloys can be used. In order to crystallize a film in the amorphous state, for example, thermal processing (annealing) can be used, as is well known in the art.

The thickness of the fixed layer will be described. In the case where the fixed layer is thin, the fixed layer has a problem that the stability of the direction of magnetization against current or heat decreases. Moreover, the thin fixed layer has another problem that it becomes difficult to form a continuous film. Conversely, in the case where the fixed layer is thick, the fixed layer causes a problem that stray magnetic field from the fixed layer to the free layer increases, and another problem that it makes the microfabrication difficult. Therefore, the thickness of the fixed layer is generally, for example, 2 to 100 nm, possibly or preferably about 2 to 10 nm, which is thicker than the thickness of the free layer.

4. Manufacturing Method

Since each of the above-mentioned layers are considerably thin, it can be formed on a substrate by using a vacuum thin-film deposition technique. As such a technique, conventional techniques, for example, a spattering method, an evaporatio method, an MBE method, an ALE method, a CVD method, and the like can be used selectively, as desired.

In the description above, only three fundamental layers, i.e. the free layer, the non-magnetic layer, and the fixed layer, have been explained. However, according to the situation, provided that the object of some embodiments is not contradicted, it would also be acceptable to add, in addition to these layers, some other layer or layers, such as an electrode layer for information extraction, a holding support layer that can support holding the direction of magnetization of the fixed layer, a magnetization adjustment support layer that can support adjustment of the easy magnetization direction of the free layer, a readout support layer (i.e. a dedicated readout layer) that can support enhancement of the readout signal during readout of the orientation of magnetization of the free layer, a cap layer, a seed layer or the like. Furthermore, it would also be possible to dispose collinear MR devices according to some embodiments in the form of an array to which an electrode layer such as described above or the like is added, and to provide wiring and associated circuitry necessary for writing and reading out information, so as to constitute the assembly as a magnetic memory (MRAM).

Some embodiments have been described above with reference to the drawings. However, the embodiments should not be considered as being limited. Furthermore, without deviation from the scope or the objectives, some embodiments may be implemented in modes in which various improvements, corrections, or modifications have been made thereto on the basis of knowledge possessed by a person having ordinary skill in the art.

The MR device according to some embodiments not only can be used as a unit cell of an MRAM (magnetoresistive random access memory), but also can be employed in a random number generator, a magnetic sensor, or the like.

What is claimed is:

1. A magnetoresistive device, including a free layer, a fixed layer, and a non-magnetic layer disposed between the free layer and the fixed layer, wherein:

the free layer has an easy magnetization direction in a perpendicular direction or in an in-plane direction;

in the case where the easy magnetization direction of the free layer is in the perpendicular direction, the fixed layer has the easy magnetization direction in the perpendicular direction, whereas, in the case where the easy magnetization direction of the free layer is in the in-plane direction, the fixed layer has the easy magnetization direction in the in-plane direction; and $K_{u1,eff}$ is assumed to be an effective first order anisotropy constant, $K_{u2}$ is assumed to be a second order anisotropy constant, and $r_K$ is assumed to be $K_{u2}/K_{u1,eff}$, then, when a bias current flowing in the free layer is in vicinity of zero, the free layer satisfies both expression (1) and expression (2) below, or satisfies both expression (3) and expression (4) below:

$$K_{u1,eff} > 0 \quad (1)$$

$$r_K \geq 0.1 \quad (2)$$

$$K_{u1,eff} = 0 \quad (3)$$

$$K_{u2} > 0 \quad (4),$$

2. The magnetoresistive device according to claim 1, wherein a normalized spin torque switching efficiency ($\kappa/\kappa^{(p0)}$) is greater than or equal to 1.1.

3. The magnetoresistive device according to claim 1, wherein $r_K$ is greater than or equal to 0.25.

4. The magnetoresistive device according to claim 1, wherein $r_K$ is greater than or equal to 0.3.

5. The magnetoresistive device according to claim 1, wherein $r_K$ is greater than or equal to 0.7.

6. The magnetoresistive device according to claim 1, wherein $r_K$ is within a range of 0.7 to 1.5.

7. The magnetoresistive device according to claim 1, wherein $r_K$ is within a range of 0.9 to 1.1.

8. The magnetoresistive device according to claim 1, wherein $r_K$ is equal to 1.

* * * * *